United States Patent [19]

Sawano

[11] Patent Number: 4,761,060

[45] Date of Patent: Aug. 2, 1988

[54] OPTICAL DELAY TYPE FLIPFLOP AND SHIFT REGISTER USING IT

[75] Inventor: Tsuyotake Sawano, Tokyo, Japan

[73] Assignee: NEC Corporation, Tokyo, Japan

[21] Appl. No.: 795,814

[22] Filed: Nov. 7, 1985

[30] Foreign Application Priority Data

Nov. 7, 1984 [JP] Japan .............................. 59-234538
Nov. 7, 1984 [JP] Japan .............................. 59-234539

[51] Int. Cl.$^4$ .......................... G02B 5/23; G02B 6/26; G02B 5/30; G02F 1/01
[52] U.S. Cl. .............................. 350/354; 350/96.15; 350/356; 350/355; 350/393
[58] Field of Search .................... 350/96.15, 353, 354, 350/96.14, 355, 356, 393

[56] References Cited

U.S. PATENT DOCUMENTS 4,573,767 3/1986 Jewell ................................. 350/354

FOREIGN PATENT DOCUMENTS 208727 12/1983 Japan .................................. 350/355
38025 9/1985 Japan .................................. 350/96.15

OTHER PUBLICATIONS

"Electro-Optic X-Switch Using Single-Mode Ti:LiNbO3 Channel Waveguides", A. Neyer, Electronics Letters, Jun. 83, pp. 553-554, vol 19, No. 14.
R. V. Schmidt, L. L. Buhl, "Experimental 4×4 Optical Switching Network", Oct. 1976, vol. 12, No. 22, pp. 575-577, Electronic Letters.
Rod C. Alferness, "Guided-Wave Devices for Optical Communication", IEEE Journal of Quantum Electronics, vol. QE-17, No. 6, pp. 946-959, Jun. 81.
Yoh Ogawa, Hiromassa Ito, & Humio Inaba, "Bistable Optical Device Using a Light Emitting Diode", Applied Optics, vol. 21, No. 11, Jun. 1982, pp. 1878-1880.
"A Microprocessor and Optoelectronics Based Packet Switch for Satellite Communications", Con. Record of IEEE Int'l Conf. on Comm., pp. 15.3.1-15.3.5, 1981.
Conf. Rpt. #937, Inst. of Electronics and Communication Engineers of Japan in Apr. 1983.

Primary Examiner—Eugene R. LaRoche
Assistant Examiner—Michael B. Shingleton
Attorney, Agent, or Firm—Sughrue, Mion, Zinn, Macpeak & Seas

[57] ABSTRACT

An optical D flipflop comprising a 2×1 optical switch and a optical bistable element. The flipflop has a first input end adapted to receive optical digital data, a second input end adapted to receive a biasing optical signal and at least one output end for emitting a light beam comprising the bias signal or optical information pulses, depending upon the state of a clock signal applied to the signal flip flop switch. The flip flops, when connected in cascade through light branching circuits, act as a shift register.

11 Claims, 10 Drawing Sheets

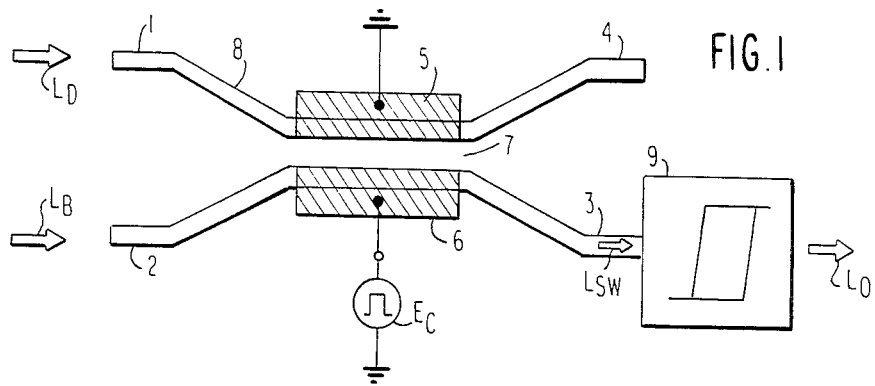
FIG.1
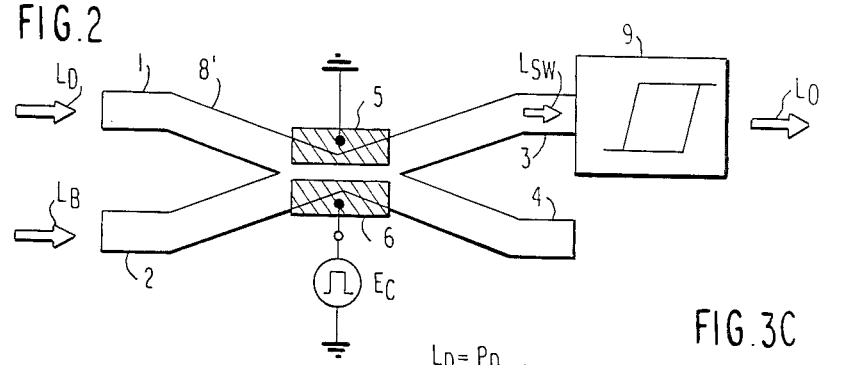
FIG.2
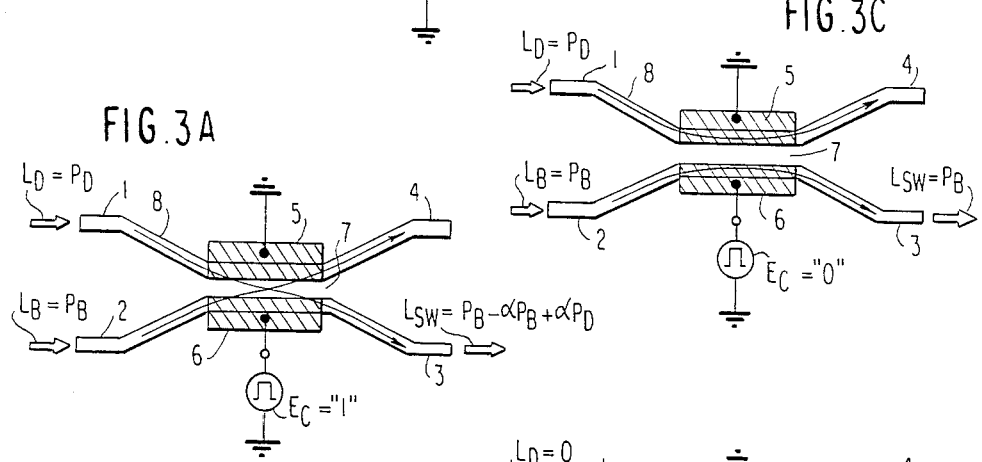
FIG.3A
FIG.3B
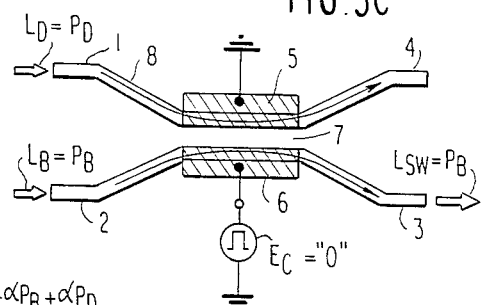
FIG.3C
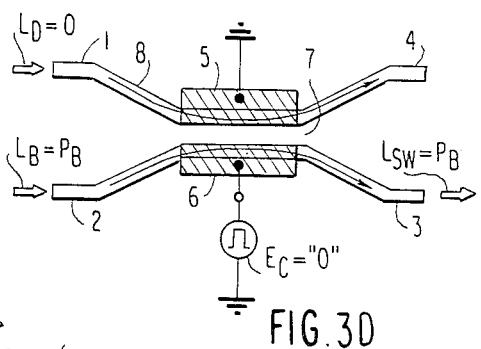
FIG.3D

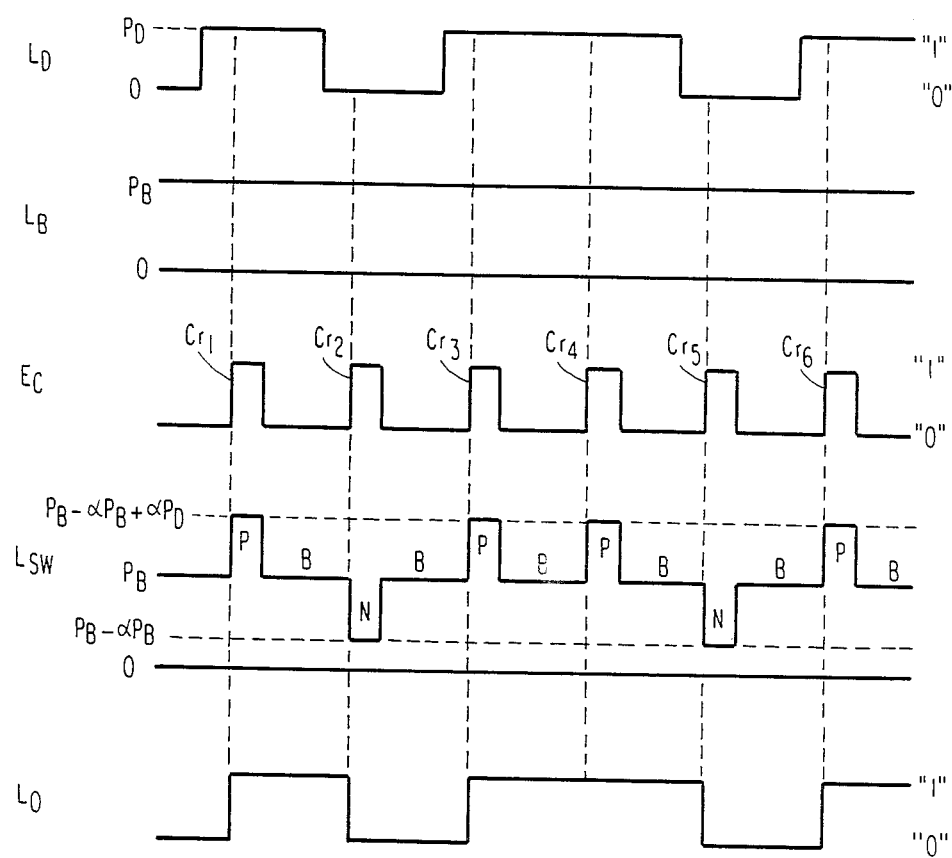

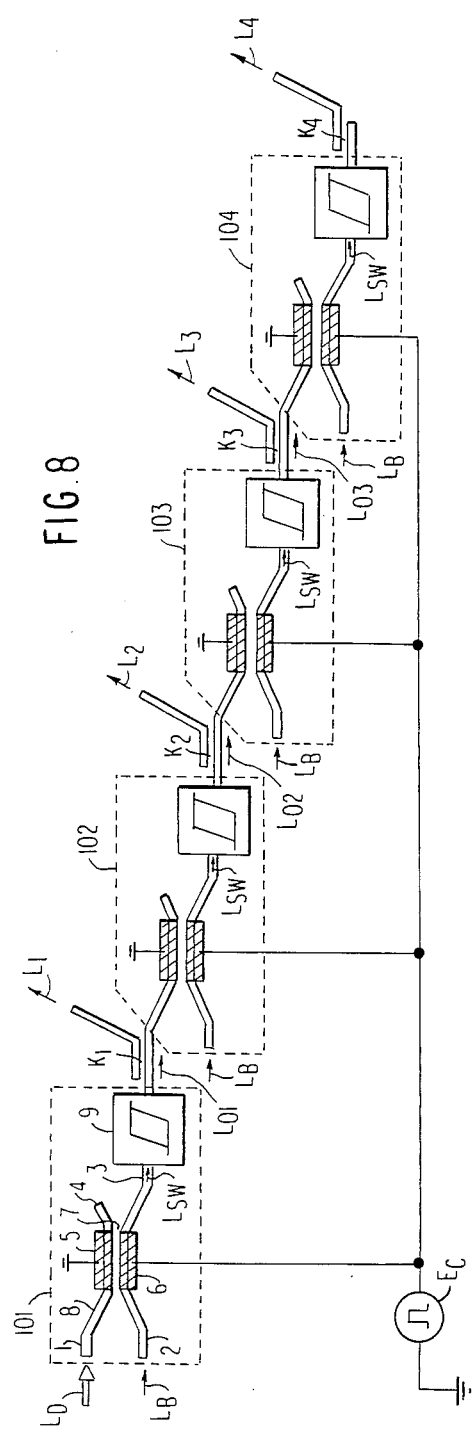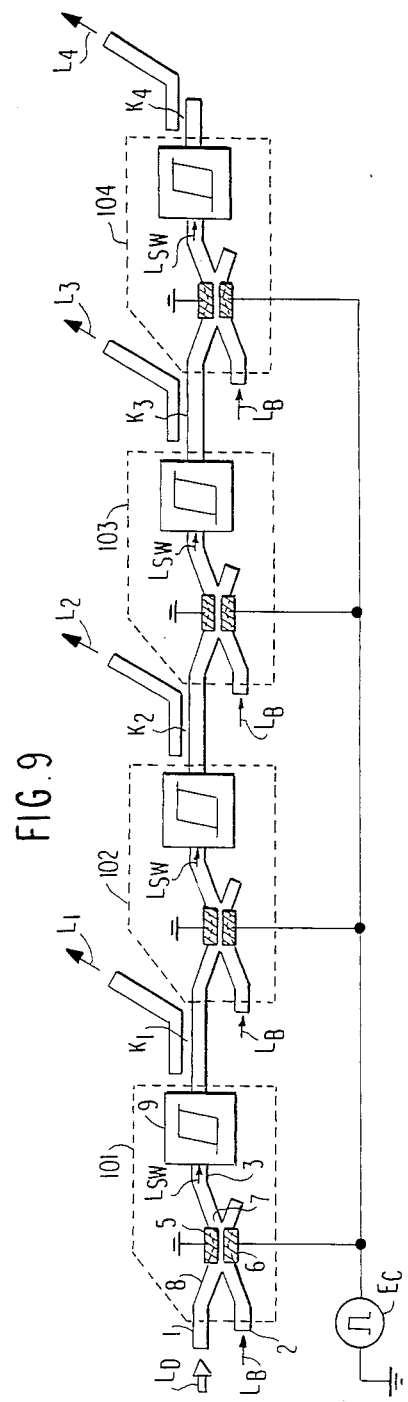

OPTICAL DELAY TYPE FLIPFLOP AND SHIFT REGISTER USING IT

BACKGROUND OF THE INVENTION

1. Field of the Invention

The present invention relates to an optical digital logical operation circuit for use in optical communication systems, optical data processing systems, optical switching systems and optical computers, and more particularly to an optical delay (D) flipflop and a logical operation circuit using it.

2. Prior Art

With the progress of optical fiber and optical semiconductor technologies in recent years, long-haul optical communication systems have become practical and optical LAN systems for highly efficient connection of distributed processing systems.

In these systems, optical techniques are mainly used for the interconnection of functional units. Such units employ electronic circuitry which is fabricated by large-scale integrated circuits (LSIs).

With the further diversification and increasing volume of information to be handled by such systems, reflecting the development of a highly information-oriented society in the near future, requirements are growing for even faster and more complex processing of information.

To meet these requirements, it has become necessary to utilize optical techniques not only as connecting means but also as logical processing means.

Accordingly optical processing systems (including optical data processing systems and optical switching systems), which fully utilize the high speed, broad bandwidth and induction-immunity of light, are required. In such systems, it is necessary to digitally process optical digital signals as they are, and to optically transmit the results of such processing to other systems. To realize such systems, optical logic functional blocks like those used in common electric logical operation circuits must be designed.

In particular, optical flipflops and optical shift registers, whose components include such flipflops, are important optical logic blocks that will be used in composing an optical processing system.

In the prior art, optical logical operation circuits are hybrids of optical circuits and electronic circuits. Thus a typical such device receives optical digital data with a light receiving element, converts the optical data to electrical data for processing with an electronic circuit, and then drives a light emitting element to provide output optical digital data.

For example in an article, "A Microprocessor and Optoelectronics Based Packet Switch for Satellite Communications" in the Conference Record of the IEEE International Conference on Communications, pp. 15.3.1 to 15.3.5, 1981, is disclosed an optical shift register. In this shift register, each bit is stored in a combination of a photodiode, a light emitting diode (LED), connected in series, and a 1×2 optical switch. Optical digital data are received by the photodiode and are converted into electric signals, which actuate the LED. The light output from the LED, when the 1×2 optical switch is in crossover mode, excites the photodiode of the current bit, and then excites the LED of the current bit to achieve a self-sustained state. On the other hand, when the 1×2 optical switch is in parallel mode, the light output from the LED excites the photodiode of the next bit. Said optical switch is clock-controlled, and the content of each bit is transferred to the immediately following bit.

The performance characteristics of these prior art structures, wherein optical digital data are processed through electronic circuits, are affected by the performance characteristics of the electric circuits. Thus the stray inductance and the stray capacitance resulting from the composition of such an electronic circuit will deteriorate the bandwidth of the device thereby adversely affecting the high speed and broad bandwidth of optical signals. Accordingly it is difficult to realize a light processing system, to which a broad bandwidth and high speed are important, by the use of conventional optical flipflops and optical shift registers.

SUMMARY OF THE INVENTION

An object of the present invention is to provide, in view of these problems inherent in the prior art, a wholly optical D flipflop which makes no use of electronic circuits is compact and is suitable for circuit integration, and an optical shift register using such flipflops.

According to the invention, an optical D flipflop comprises a 2×1 optical switch and an optical bistable element and an optical shift register includes a plurality of such optical D flipflops connected in tandem through light branching circuits arranged in-between. The optical D flipflop can generate light output signals, synchronized with a clock, from input optical digital data. The flipflop is operated by feeding the optical digital data to a first input end of the 2×1 optical switch. A biasing light beam (with a constant intensity level) also is fed to a second input end of the flipflop. In a first state of the optical switch, corresponding to a first state of the clock, the biasing light beam is emitted from the output end of the flipflop, and the optical bistable element is biased to either one of two stable points. In a second state of the optical switch, corresponding to a second state of the clock, a positive polarity optical pulse having a positive amplitude relative to the constant intensity level is supplied from the output end and the optical bistable element is set with the positive polarity optical pulse when the optical digital data is in a logical state of "1". In the second state, a negative polarity optical pulse having a negative amplitude relative to said constant intensity level is supplied from the output end and the optical bistable element is reset with the negative polarity optical pulse when the optical digital data is in a logical state of "0".

An optical shift register according to the invention comprises a plurality of aforementioned optical D flipflops connected in tandem through light branching circuits arranged in-between.

The above and other objects and features of this invention are illustrated in the following detailed description, in which reference is made to the accompanying drawings.

BRIEF DESCRIPTION OF THE DRAWINGS

FIG. 1 is a circuit diagram of an optical D flipflop, which is a first preferred embodiment of the invention;

FIG. 2 is a circuit diagram of an optical D flipflop, which is a second preferred embodiment of the invention;

FIG. 3 illustrates how the optical switch operates;

FIG. 4 is a truth table of the optical switch;

FIG. 5 shows logical waveforms in different parts of the optical D flipflop according to the invention;

FIG. 8 illustrates an optical shift register according to the invention, which uses a plurality of the optical D flipflops shown in FIG. 1;

FIG. 9 shows another optical shift register using a plurality of the optical D flipflops shown in FIG. 2.

DETAILED DESCRIPTION OF THE PREFERRED EMBODIMENTS

FIG. 1 illustrates an optical D flipflop circuit, which is a first preferred embodiment of the invention. The D flipflop circuit includes a directional coupler type optical switch 8 and an optical bistable element 9, connected in tandem.

Figure 6:
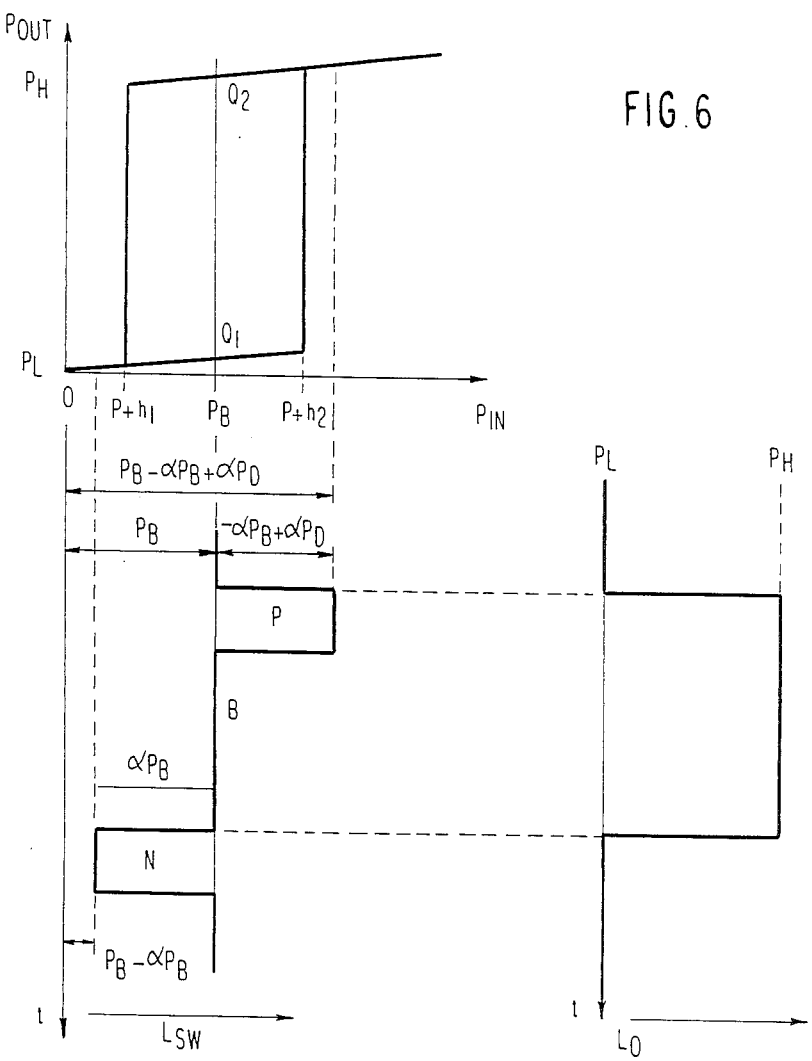
FIG. 6 shows the characteristics of an optical bistable element and the relationship between an optical input signal $L_{SW}$ thereto and output light digital data $L_O$.

The directional coupler type optical switch 8 comprises a directional coupler 7, formed over a substrate (of LiNbO$_3$, GaAs, InP or the like) and control electrodes 5 and 6. One of two states can be achieved for the switch 8 by varying the way in which voltage signals are supplied to the control electrodes 5 and 6. In one state (called the bar state), optical signals from input ends 1 and 2 are conducted to output ends 4 and 3, respectively, while in the other (called the cross state) optical signals from the input ends 1 and 2 are conducted to the output ends 3 and 4, respectively. The optical bistable element 9, has a hysteresis response characteristic, as shown in FIG. 6. Then the hysteresis of the optical output $P_{out}$ in relation to the optical input $P_{in}$ is shown; it takes two stable output intensities $P_H$ and $P_L$ within a certain range of input intensity (between threshold $P_{th1}$ and $P_{th2}$).

Figure 7:
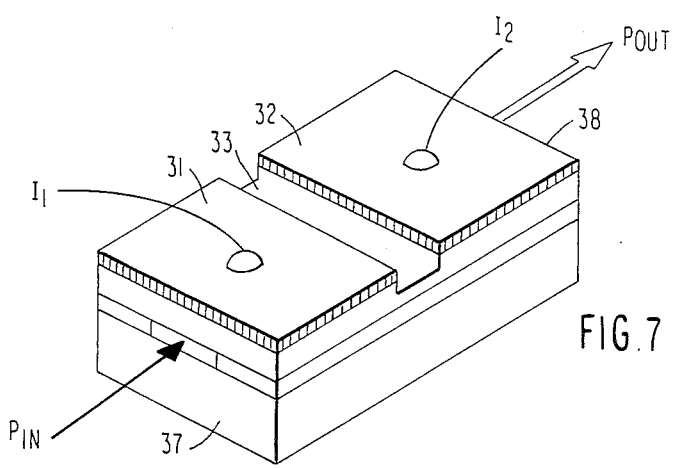
FIG. 7 illustrates an outline of an optical bistable semiconductor laser to be used in the preferred embodiments.

As an example of an element having such an optical bistable characteristic, an optical bistable semiconductor laser, illustrated in FIG. 7, was reported on at the National convention (Record) of the Institute of Electronics and Communication Engineers of Japan in April 1983 (conference report No. 937). This optical bistable semiconductor laser has bisected p-electrodes 31 and 32 electrically insulated by a slit 33 provided in parallel to Fabry-Perot etalon faces 37 and 38. As shown in FIG. 6, it is possible to optically bistabilize the relationship of the optical output $P_{out}$ to the optical input $P_{in}$ by supplying appropriate biasing currents $I_1$ and $I_2$ to the electrodes 31 and 32, respectively.

Described below is the logical operation of the optical D flipflop circuit according to the present invention with reference to FIG. 1. An optical digital data $L_D$ is supplied to the input end 1, and a biasing light beam $L_B$ is supplied to the input end 2. The optical amplitude of the optical digital data $L_D$ is, as shown in FIG. 5, zero in a logical state of "0", or $P_D$ in a logical state of "1".

Meanwhile, the biasing light beam $L_B$ is a constant intensity beam intended to bias the optical bistable element 9 and, as shown in FIG. 5, having an optical D.C. amplitude $P_B$. Referring back to FIG. 1, the optical switch 8 is controlled by feeding an electric clock $E_c$ to the electrodes 5 and 6. The electric clock $E_c$ sets the optical switch 8 in a cross state when the logical state is "1", or in a bar state when it is "0". The optical switch 8 here is designed to have a coupling index $\alpha$ of not greater than 1 in its cross state. Accordingly, the optical output signal $L_{SW}$ to the output end 3 of the optical switch 8 is determined as follows according to the logical state of the electric clock $E_c$. When the logical state of the electric clock $E_c$ is "0", since the optical switch 8, as shown in FIGS. 3C and 3D, takes its bar state then, the optical output signal $L_{SW}$ becomes the biasing light beam $L_B$ itself, and its optical amplitude is $P_B$. Meanwhile, the logical state of the electric clock $E_c$ is "1", since the optical switch 8, as shown in FIGS. 3A and 3B, takes its cross state then, there is obtained an optical output signal $L_{SW}$ dependent on the logical state of the optical digital data $L_D$. Thus when the logical state of the optical digital data $L_D$ is "1", as shown in FIG. 3A, $\alpha P_B$, a part of the optical amplitude $P_B$ of the biasing light beam $L_B$, is coupled to the output end 4 and $\alpha P_D$, a part of the optical amplitude of the optical digital data $L_D$, is to the output end 3, so that the optical amplitude of the optical output signal $L_{SW}$ is $P_B - \alpha P_B + \alpha P_D$. Meanwhile, when the logical state of the optical digital data $L_D$ is "0", as shown in FIG. 3B, the optical amplitude of the optical digital data $L_D$ is zero, so that no coupling takes place from the optical digital data $L_D$ to the output end 3, but only $\alpha P_B$, a part of the optical amplitude $P_B$ of the biasing light beam $L_B$, is coupled to the output end 4. Therefore, the optical amplitude of the optical output signal $L_{SW}$ then is $P_B - \alpha P_B$.

The relationship between the truth values and the optical amplitudes described above is summed up in FIG. 4. If the coupling index $\alpha$ and the optical amplitude $P_D$ are so selected as to make the optical amplitude $P_B - \alpha P_B + \alpha P_D$ greater than the constant intensity $P_B$, the optical output signal $L_{SW}$, as shown in FIG. 6, will have a base line B with the DC amplitude $P_B$, a positive polarity pulse P with the optical amplitude $P_B - \alpha P_B + \alpha P_D$ and a negative polarity pulse N with the optical amplitude $P_B - \alpha P_B$.

As shown in FIG. 5, the optical output signal $L_{SW}$ will become the base line B when the logical state of the electric clock $E_c$ is "0". LSW will become the positive pulse P when the logical state of the electric clock $E_c$ is "1" and the optical digital data $L_D$ also is "1". LSW will become the negative pulse N when the logical state of the electric clock $E_c$ is "1" and the optical digital data $L_D$ is "0".

Now, referring again to FIG. 1, the optical output signal $L_{SW}$ is entered into the optical bistable element 9. If the characteristic of the optical bistable element 9 and the optical amplitude of the optical output signal $L_{SW}$ satisfy, as shown in FIG. 6, the relationship of Formulas (1), $$\left. \begin{array}{l} P_{th1} < P_B < P_{th2} \\ P_B - \alpha P_B + \alpha P_D > P_{th2} \\ P_B - \alpha P_B < P_{th1} \end{array} \right\} \quad (1)$$

the optical bistable element 9 will be set (i) at the high value $P_H$ in response to the positive pole pulse P, (ii) at the low value $P_L$ in response to the negative pole pulse N, and (iii) biased to either of the two stable points $Q_1$ or $Q_2$ and kept at either the low value $P_L$ or the high value $P_H$ in response to the base line B (the biasing light beam $P_B$). As a result, there is provided output light digital data $L_O$ as shown on the right hand side of FIG. 6. Eventually, as shown in FIG. 5, the optical signals resulting from the synchronization of the optical digital data $L_D$ with the leading edges $C_{r1}$, $C_{r2}$, ... of the electric clock $E_C$ are provided as output light digital data $L_O$. Therefore, optical D flipflop operation is realized with the circuitry of FIG. 1.

Next will be described another optical D flipflop, a second preferred embodiment of the present invention.

FIG. 2 illustrates the optical D flipflop, which is the second preferred embodiment of the invention and has the same structure as the first embodiment except that a crossover waveguide type optical switch 8' is used in place of a directional coupler type switch. The crossover waveguide type optical switch 8' includes a crossover waveguide 10 and control electrodes 5 and 6 formed over a substrate (of LiNbO$_3$, GaAs, InP or the like). When the electric clock $E_C$ is in a logical state of "0", the optical digital data $L_D$ at the input end 1 is coupled to the output end 4, and the biasing light beam $L_B$ is to the output end 3. Therefore, the optical output signal $L_{SW}$ becomes the biasing light $L_B$ itself. Meanwhile when the electric clock $E_C$ supplied to the control electrodes 5 and 6 is in a logical state of "1", the refractive index of the waveguide between the control electrodes 5 and 6 is reduced with the result that $\alpha P_B$, a part of the optical amplitude $P_B$ of the biasing light beam $L_B$ is coupled to the output end 4 and the remainder, $P_B - \alpha P_B$, is supplied to the output end 3. Further to the output end 3, when the logical state of the optical digital data $L_D$ is "1", the $\alpha P_D$ portion of its optical amplitude $P_D$ is supplied, but nothing is supplied when the logical state of the optical digital data $L_D$ is "0". The optical switch 8' here is designed to have a coupling index $\alpha$ of not greater than 1.

In this way, as with the first preferred embodiment, there is provided an optical output signal $L_{SW}$ having a positive pulse P and a negative pulse N with a base line B as intermediate value. If this optical output signal $L_{SW}$ is entered into the optical bistable element 9, there can be achieved output light digital data $L_O$ resulting from the synchronization of the optical digital data $L_D$ with the electric clock $E_c$.

It has therefore been revealed that the preferred embodiment illustrated in FIG. 2 can operate as an optical D flipflop.

Since compact optical D flipflops suitable for circuit integration can be realized by the use of optical switches and optical bistable elements as hitherto described, there can be structured optical logical circuits utilizing such characteristics of light as broad bandwidth and non-inductivity.

By applying these optical D flipflops as basic elements, there can be realized a novel optical shift register.

FIG. 8 illustrates a first preferred embodiment of a four-bit optical shift register using as basic elements optical D flipflops of the type shown in FIG. 1. This optical shift register comprises optical D flipflops 101, 102, 103 and 104, each of the same composition as that of FIG. 1, connected in tandem through light branching circuits $K_1$, $K_2$, $K_3$ and $K_4$, which consist of directional couplers for taking out light output signals $L_1$, $L_2$, $L_3$ and $L_4$, respectively, at the corresponding stages of optical D flipflop.

By commonly supplying an electric clock $E_c$ to all the stages of optical D flipflop, the light output signals L01, L02 and L03 of the first three stages of optical D flipflop are synchronized by the optical D flipflops 102, 103 and 104 of the respectively following stages with the leading edges $C_{r1}$, $C_{r2}$, $C_{r3}$, ... of the electric clock $E_c$.

Figure 10:
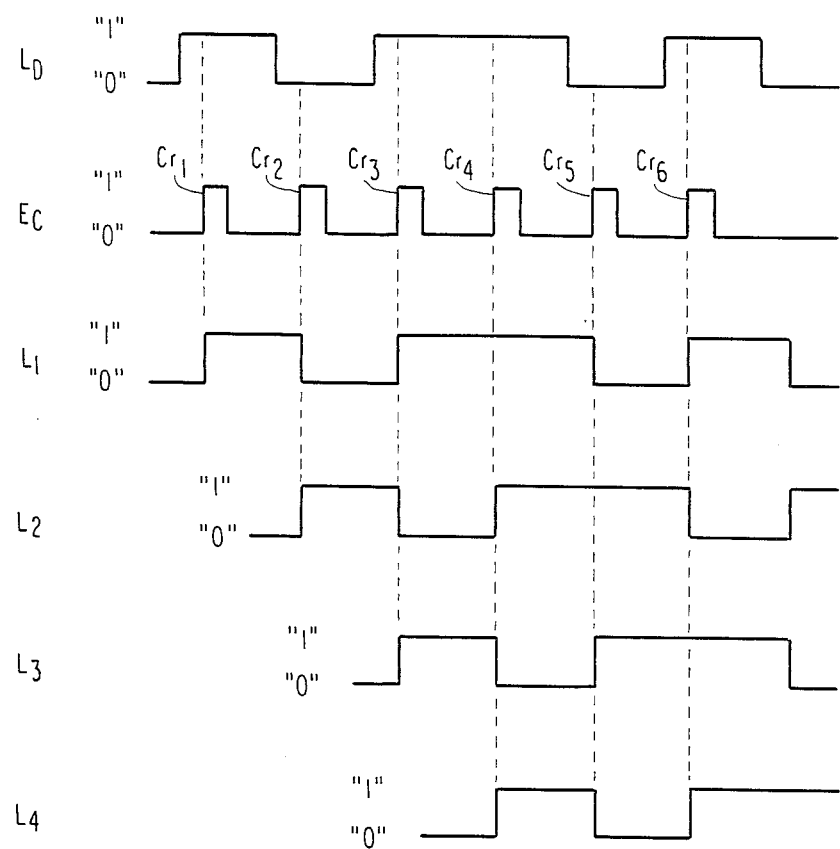
FIG. 10 is a timing chart of the operation of an optical shift register.

Therefore, the light output signals $L_1$, $L_2$, $L_3$ and $L_4$ of the light branching circuits $K_1$, $K_2$, $K_3$ and $K_4$, as shown in FIG. 10, are delayed by one, two, three and four bits, respectively.

Whereas the foregoing is an example in which optical D flipflops are connected through light branching circuits, flipflops may as well be directly connected without inserting light branching circuits in-between. In this case, however, the output can be obtained only from the final stage. The same can be said of another embodiment cited below.

Next will be described another optical shift register embodying the present invention.

FIG. 9 illustrates a second preferred embodiment of optical shift register using optical D flipflops shown in FIG. 2 as basic elements. Like in the first embodiment, optical D flipflop circuits 101, 102, 103 and 104 are connected in tandem through branching circuits $K_1$, $K_2$, $K_3$ and $K_4$. This second embodiment differs from the first in that crossover waveguide type optical switches 8', shown in FIG. 2, are used as optical switches to partly constitute the optical D flipflops.

As hitherto described, there can be realized a fully optical type compact optical shift register suitable for circuit integration, using as basic components optical D flipflops each consisting of an optical output-switch and an optical bistable element, so that transmitted optical digital data can be subjected to digital arithmetic processing as they are, resulting in an important contribution to the construction of high speed optical information processing systems, optical switching systems and optical computers.

Although optical switches, optical bistable elements and optical branching circuits were treated as separate components in the foregoing description, if their functions are integrated over a single substrate, obviously there can be realized compact and economical optical D flipflops and optical shift registers.

Further, although directional coupler type optical switches and crossover waveguide type optical switches, optical bistable semiconductor lasers and directional couplers are cited in the foregoing description as examples of optical switches, optical bistable elements and optical branching circuits, respectively, elements to be used for embodying the present invention obviously are not limited to them, but others that satisfy the functional requirements referred to above can be applied to realize optical D flipflops and optical shift registers according to the invention.

Still further, although four-bit optical shift registers are cited above as examples of optical shift register, embodiments of the present invention are not limited to such registers, but multi-bit optical shift register circuits can as well be realized by connecting in tandem any large number of such optical D flipflop circuits.

What is claimed is:

1. An optical D type flipflop for switching incident light beams having variable intensities in response to a source of control signals comprising:
    an optical switch means, having a first input end and a second input end adapted to receive said incident beam, at least one output end, and a control means, said switch means being adapted to switchably couple the incident light beams from said first and second input ends to said output end responsive to control signals applied to said control means, and a bistable optical means optically coupled to said output end of said optical switch and responsive to the intensity of said incident light beams for generating two stable light outputs, wherein:

said incident light beams include a biasing light beam having a constant amplitude level and being incident on said first input end, an information light beam having two amplitude levels according to a logical level and being incident on said second input end, and a clock pulse is supplied as said control signal, and said bistable optical element outputs the logical value of said optical signal in response to said clock pulse.

2. An optical D type flipflop as claimed in claim 1 wherein said optical switch means is either an optical directional coupler switch or an optical crossover waveguide switch.

3. An optical shift register for processing incident light beams having variable intensities in response to a source of control signals comprising:

a plurality of optical D type flipflops, each flipflop including:

an optical switch means, having a first input end and a second input end adapted to receive said incident beams, at least one output end, and a control means, said switch means being adapted to switchably couple the incident light beams from said first and second input ends to said output end responsive to control signals applied to said control means, and a bistable optical means optically coupled to said at least one output end and responsive to the intensity of the incident light beams for generating two stable light outputs, said flipflops being connected in tandem such that the output light beam of the optical D type flipflop of each stage is optically coupled to the input of the optical D type flipflop of the immediately following stage, wherein:

said incident light beams include a biasing light beam having a constant amplitude level and being incident on said first input end, an information light beam having two amplitude levels according to a logical level and being incident on said second input end, and a clock pulse is supplied as said control signal, and said bistable optical element outputs the logical value of said optical signal in response to said clock pulse.

4. An optical shift register, as claimed in claim 3, wherein said optical D type flipflop of each stage is optically coupled to the optical D type flipflop of the immediately following stage through light branching means.

5. A shift register as claimed in claim 3 wherein said optical switch means is either an optical directional coupler switch or an optical crossover waveguide switch.

6. An optical D type flipflop for switching incident light beams having variable intensities in response to a source of control signals comprising:

an optical switch means, having a first input end and a second input end adapted to receive said incident beams, at least one output end, and an electrical control means, said switch means being adapted to switchably couple the incident light beams from said first and second input ends to said output end responsive to electrical control signals applied to said electrical control means, and said optical switch means being adapted to provide said output end with a light output containing a set optical pulse and a reset optical pulse which differs from said set optical pulse in polarity with respect to a reference optical level, and a bistable optical means optically coupled to said output end of said optical switch means and responsive to said set optical pulse and reset optical pulse of said light output, respectively, for setting said bistable optical means at one stable state and for resetting said bistable optical means at another stable state.

7. An optical D type flipflop, as claimed in claim 6, wherein: said set and reset optical pulses are synchronized with said electrical control signals.

8. An optical D type flipflop, as claimed in claim 7, wherein:

said incident light beams include a biasing light beam having a constant level and being incident on said first input end, an information light beam having two constant levels according to a logical level and being incident on said input end, a clock pulse is supplied as said control signal, and said bistable optical element outputs the logical value of said optical signal in response to said clock pulse.

9. An optical shift register for processing incident light beams having variable intensities in response to a source of control signals comprising:

a plurality of optical D type flipflops, each flipflop including:

an optical switch means, having a first input end and a second input end adapted to receive said incident beams, at least one output end, and an electrical control means, said switch means being adapted to switchably couple the incident light beams from said first and second input ends to said output end responsive to electrical control signal applied to said electrical control means, said optical switch means being adapted to provide said output end with a light output containing a set optical pulse and a reset optical pulse which differs from said set optical pulse in polarity with respect to a reference optical level, and a bistable optical means optically coupled to said at least one output end and responsive to said set optical pulse and reset optical pulse of said light output, respectively, for setting said bistable optical means at one stable state and for resetting said bistable means at another stable state, said flipflop being connected in tandem such that the output light beam of the optical D type flipflop of each stage is optically coupled to the input of the optical D type flipflop of the immediately following stage.

10. An optical shift register, as claimed in claim 9, wherein:

said set and reset optical pulses are synchronized with said electrical control signals.

11. An optical shift register, as claimed in claim 10, wherein:

said incident light beams include a biasing light beam having a constant level and being incident on said first input end, an information light beam having two constant levels according to a logical level and being incident on said input end, a clock pulse is supplied as said control signal, and said bistable optical element outputs the logical value of said optical signal in response to said clock pulse.

* * * * *